United States Patent [19]

Viswanathan

[11] Patent Number: 4,783,602
[45] Date of Patent: Nov. 8, 1988

[54] OPERATIONAL TRANSCONDUCTANCE AMPLIFIER FOR USE IN SAMPLE-AND-HOLD CIRCUITS AND THE LIKE

[75] Inventor: Tandur L. Viswanathan, Wyomissing Hills Township, Berkes County, Pa.

[73] Assignee: American Telephone and Telegraph Company, AT&T Bell Laboratories, Murray Hill, N.J.

[21] Appl. No.: 67,331

[22] Filed: Jun. 26, 1987

[51] Int. Cl.$^4$ .......................... G11C 27/02; H03F 3/45
[52] U.S. Cl. ..................................... 307/353; 330/255; 330/257
[58] Field of Search ................. 307/353; 330/255, 257; 328/151

[56] References Cited

U.S. PATENT DOCUMENTS

| | | |
|---|---|---|
| 3,643,110 | 2/1972 | Thompson . |
| 3,921,090 | 11/1975 | Wheatley, Jr. et al. ............ 330/257 |
| 4,267,519 | 5/1981 | Schade, Jr. ........................ 330/255 |
| 4,636,744 | 1/1987 | King et al. ........................ 330/255 |

OTHER PUBLICATIONS

B. J. Hosticka, Dynamic Amplifiers in CMOS Technology Electronics Letters, Dec. 1979, vol. 15, No. 25, pp. 819–820.
"Microelectronic Circuits", Adel S. Sedra and Kenneth E. Smith, 1982, MOS Amplifier with Enhancement MOS Load, pp. 323 and 324.
"Active Filter Design Using Operational Transconductance Amplifiers: A Tutorial", Randall L. Geiger and Edgar Sanchez-Sinencio, IEEE Circuits and Devices Magazine, Mar. 1985, pp. 20 through 32.
"A Precision Autozeroing Sample and Hold Integrated Circuit", Frank Gasparik, IEEE Journal of Solid-State Circuits, vol. SC-15, No. 6, Dec. 1980, pp. 945 through 949.
"A Precision FET-Less Sample-and-Hold with High Charge-to-Droop Current Ratio", George Erdi and Paul R. Henneuse, IEEE Journal of Solid-State Circuits, vol. SC-13, No. 6, Dec. 1978, pp. 864 through 873.

Primary Examiner—John Zazworsky
Attorney, Agent, or Firm—Scott W. McLellan

[57] ABSTRACT

An improved operational transconductance amplifier (OTA) for use in sample-and-hold circuits or the like requiring very low output leakage currents and equalized output current transients when the OTA is placed in stand-by (disabled.) The OTA has an output stage that is referenced to ground by having two darlington pairs with common collector outputs as the output for the OTA in a common base configuration such that when the OTA is disabled, any leakage paths from the output of the OTA are coupled to ground. Further, the OTA is compensated internally to equalize any current transient output when the OTA is placed in stand-by such that the integral of the current transient out of the OTA is substantially the same as the integral of the current transient into the OTA from the integrator. A sample-and-hold circuit is also described utilizing the improved OTA.

27 Claims, 2 Drawing Sheets

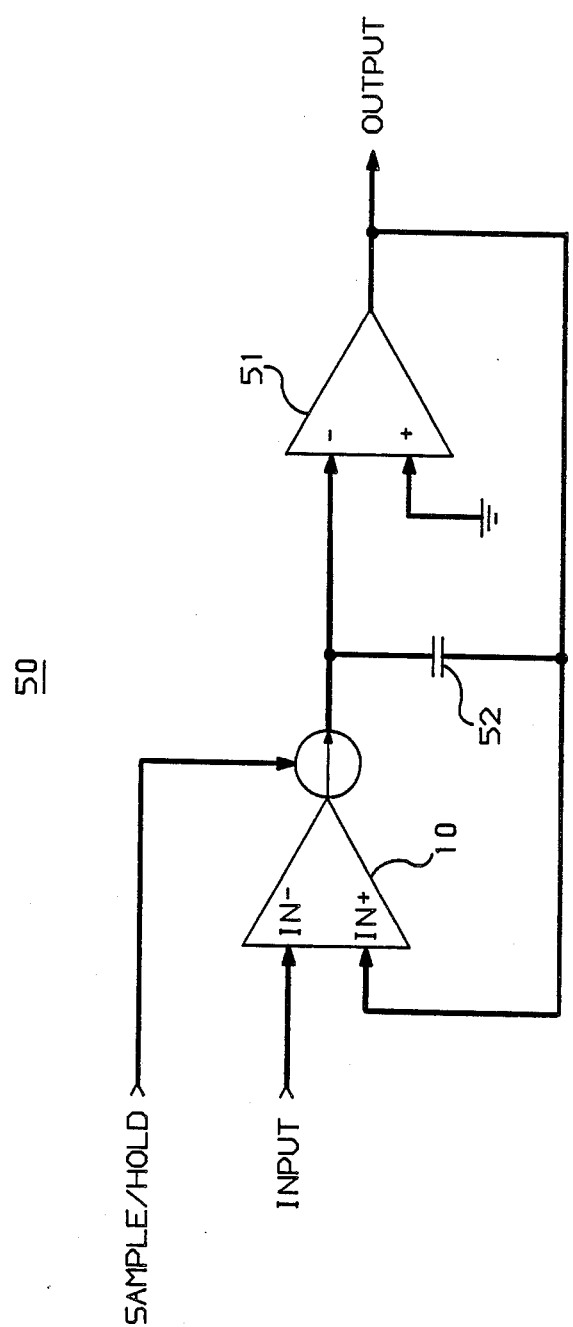

OPERATIONAL TRANSCONDUCTANCE AMPLIFIER FOR USE IN SAMPLE-AND-HOLD CIRCUITS AND THE LIKE

FIELD OF THE INVENTION

This invention relates generally to operational transconductance amplifiers (OTAs), and more particularly, to OTAs used in sample- and-hold (S&H) circuits and the like.

BACKGROUND OF THE INVENTION

Sample-and-hold (S&H) circuits are used to sample an input signal and store that sample for a predetermined time period. These circuits are widely used in signal processing applications. During the sample mode of operation, the output of the S&H is a replica of the input signal. During the hold mode, the output retains the value of the input signal at the instant the S&H enters the hold mode from the sample mode. The better the S&H, the more accurate the held value is to the input value at that instant. However, switching transients by the internal circuitry of the S&H introduce an error in the resulting held value, referred to as a pedestal error or hold step. Further, the better the S&H, the lower the drift (droop rate) of the held value with time.

S&H circuits have three basic components: an input amplifier, an integrator or storing means, and a coupling means which selectively couples the input amplifier to the integrator during the sample mode and decouples the integrator from the amplifier during the hold mode. Some designs employ a conventional operational amplifier as the input amplifier with a series of diodes or transistors adapted to form the coupling means. The integrator is usually a suitably adapted capacitor. The operational amplifier as an input amplifier has the disadvantage of low impedance output so that the coupling means (diodes or transistors) must have a low impedance during the sample mode and a high impedance (with very low leakage) during the hold mode. A second approach integrates the input amplifier and the coupling means by using an operational transconductance amplifier (OTA) as the input amplifier. The OTA is additionally responsive to the output signal from the integrator for negative feedback. The OTA has a very high output impedance such that a separate coupling means is not needed. Current is sourced (or sinked) by the OTA during the sample mode (the OTA is active) to force the charge in the capacitor integrator and, hence, the output signal to follow the input signal. However, the OTA, as known in the prior art, has significant leakage current when disabled (the OTA is in stand-by) during the hold mode, thereby increasing the drift rate of the S&H. Further, as the S&H transitions from the sample to the hold mode, the OTA introduces significant extraneous transient current spikes into the integrator, generating the pedestal error.

SUMMARY OF THE INVENTION

In accordance with the present invention, an improved operational transconductance amplifier (OTA) for use in sample-and-hold circuits or the like is presented have very low output current leakage when disabled and having controlled turn-off characteristics such that the effect of current spikes produced when the OTA is turned off are neutralized. Such an OTA is characterized by a differential input stage having inverting and non-inverting differential inputs, a common output and first and second differential outputs; a first current mirror responsive to the first differential output of the differential input stage and coupling to a first voltage source; a second current mirror responsive to the second differential output of the differential input stage and coupling to the first voltage source; a third current mirror responsive to the first current mirror and coupling to a second voltage source; and a transistor network coupling between the second and third current mirrors, having an intermediate node coupling to the third voltage source, for providing a high-impedance output signal to an output; wherein the third voltage source has a voltage betwen that of the first and second voltage sources, usually ground or zero volts. In addition, the first current mirror is adapted to decay its output at a predetermined rate when the first current mirror is turned off; wherein the predetermined rate is established such that the integral of any output current transient from the OTA is substantially the same as the integral of any current transient into the OTA when the OTA is disabled.

Further, a sample-and-hold (S&H) circuit, embodying the improved OTA recited above, is described having an integrator with an output and a virtual ground input responsive to the output of the OTA and an output; wherein the non-inverting input of the OTA is responsive to the output of the integrator and the inverting input of the OTA is responsive to an input signal.

BRIEF DESCRIPTION OF THE DRAWING

The foregoing features of this invention, as well as the invention itself, may be more fully understood from the following detailed description of the drawings, in which.

DETAILED DESCRIPTION

Figure 1:
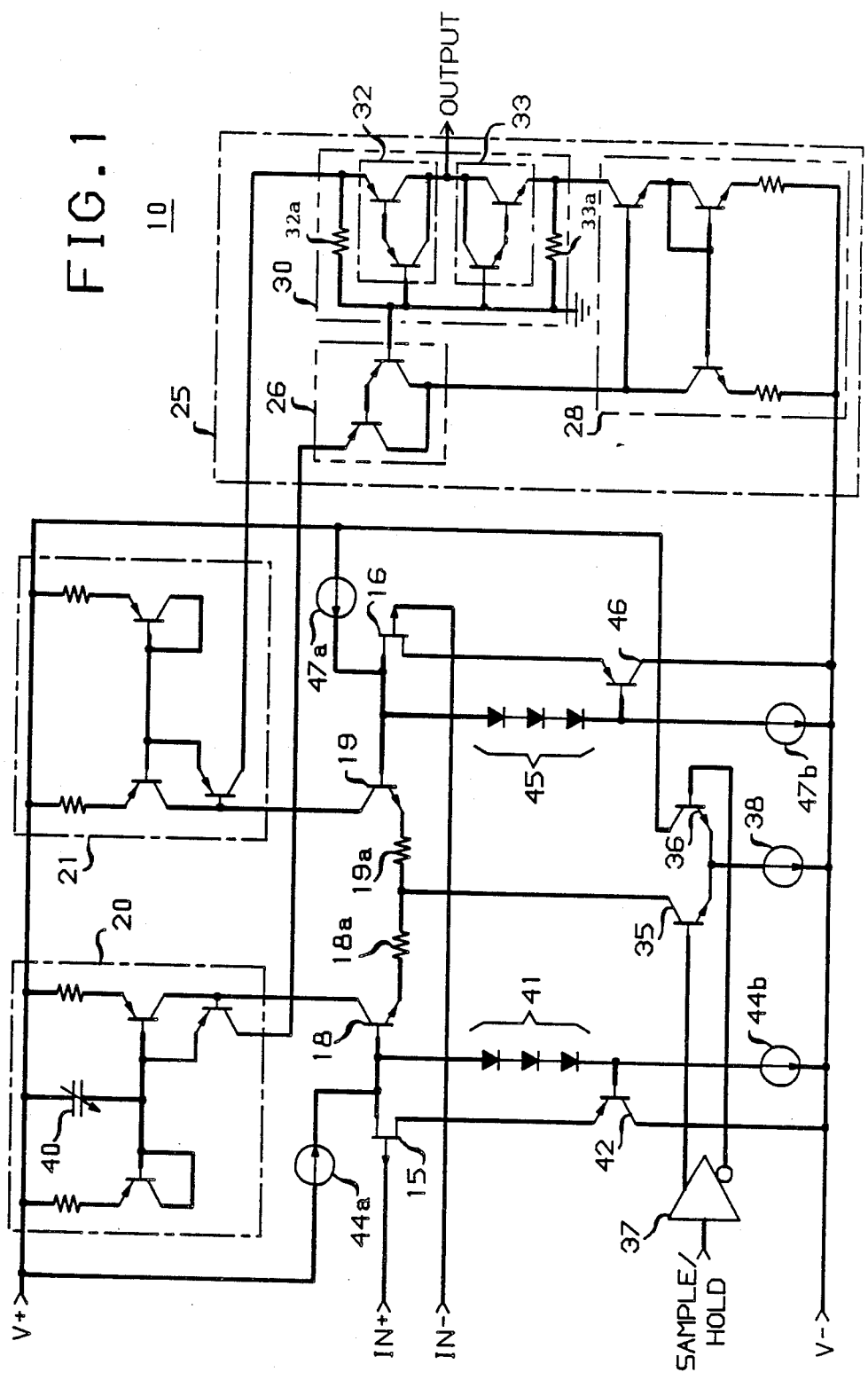
FIG. 1 is a schematic diagram of the improved operational transconductance amplifier; and, FIG. 2 is a diagram of a sample-and-hold embodying the improved operational transconductance amplifier.

An operational transconductance amplifier (OTA), as understood in the art and for purposes here, is an amplifier having a differential input responsive to a differential input voltage and a non-differential (single-ended) high-impedance current output, the current output being proportional to the differential input voltage. It is understood that, for purposes here, when the OTA is used in a sample-and-hold (S&H) configuration, the output of the OTA is at virtual ground at all times. Referring to FIG. 1, the improved OTA 10 is diagrammed. The differential input, IN+, IN− is coupled to the gates of junction field-effect transistors (JFET) 15, 16, respectively. The transistors 15, 16 in turn drive transistors 18, 19 which form a differential pair. Resistors 18a, 19a in series with the emitters of transistors 18, 19 increases the bandwidth of the differential pair and reduces the gain thereof. The collectors of transistors 18, 19 couple to V+, the most positive supply voltage through the control inputs of corresponding current mirrors 20, 21, here Wilson current mirrors. Current mirror operation is well understood and are discussed in more detail in "Analysis and Design of Analog Integrated Circuits", by P.R. Gray and R. G. Meyer, 1977, pp. 208–210, but for purposes here, the current mirror provides a controlled current that is substantially equal to the current flowing through the control input thereof. It is understood that other current mirror configurations could be used; however, the Wilson configuration provides a higher output impedance than other configurations, e.g., a Widlar current mirror. Outputs of current mirrors 20, 21 couple to the output stage 25. The output of current mirror 20 couples to a darlington pair 26 arranged in a common base configuration, the purpose of which will be explained in detail below, but for purposed here, the current flowing out the collector output terminal of the darlington pair 26 is virtually the same as the current flowing into the emitter input terminal of the pair 26 due to the high current gain of the pair and the common base configuration thereof. The collector output of the darlington pair 26 couples to V−, the most negative supply voltage through the control input of a third current mirror 28, here a Wilson current mirror. Output of the current mirror 28, and the output of the current mirror 21, couples to an output buffer 30. Output buffer 30 comprises two darlington pairs 32, 33 with coupled collector output terminals and arranged in a common base configuration with the base input terminals of each coupled to ground. As with the darlington pair 26, the current flowing out of the collector output terminals of the pairs 32, 33 are substantially the same as the current flowing through the corresponding emitter input terminals. The common collector terminals of the pairs 32, 33 form the high-impedance output of the OTA 10, the output current being the algebraic sum of the currents flowing through the darlington pairs 32, 33. Resistors 32a, 33a insure that corresponding darlington pairs 32, 33 turn off when current mirrors 21 and 28 no longer supply current (are turned off) to the output buffer 30 by supplying a path for any leakage currents from current mirrors 21, 28. The resistances of resistors 32a, 33a are essentially the same and are chosen such that the voltage drop across each resistor due to the leakage currents is less than the turn-on voltage of the corresponding darlington pairs 32, 33. It is noted that because of the grounded base configuration of the darlington pairs 32, 33 and the fact that the output of the OTA 10 is at virtual ground, the leakage current from the output buffer 30 when the current mirrors 21 and 28 are off is essentially zero. The lack of leakage currents results from the collector-base junctions in darlington pairs 32, 33 having essentially zero volts thereon with a virtual ground load coupled to the output of buffer 30.

To insure balanced operation of the OTA 10, i.e., symmetrical response to both positive and negative input signals, the darlington pair 26 keeps the voltage on the output of the current mirror 20 substantially the same as that on the output of the current mirror 21 since both darlington pairs 26, 32 have their respective base input terminals at ground potential. This neutralizes any early effect on the mirrors 20, 21 due to different output voltages.

Referring again to the transistors 18, 19, the common connection of resistors 18a and 19a couple to the collector of transistor 35, which, along with transistor 36, form a second differential pair adapted to operate as a switch. The collector of transistor 36 couples to V+ and the common emitter terminal of transistors 35, 36 coupled to V− through current source 38. Current source 38 establishes the transconductance of the OTA 10 by supplying a predetermined amount of current to the differential pair, transistors 18, 19. When the OTA 10 is active, the SAMPLE/HOLD input is active and amplifier 37 drives transistor 35 into conduction and transistor 36 is cut-off, allowing essentially all the current from current source 38 to flow through transistors 18 and 19. However, when the OTA is in the stand-by mode, the SAMPLE/HOLD input is disabled and amplifier 37 drives transistor 36 into conduction and transistor 35 is cut-off, turning off transistors 18, 19. This results in current mirrors 20, 21 being turned off and, in turn, current mirror 28 being turned off. With current mirrors 21 and 28 off, the output buffer 30 is turned off and, as discussed above, buffer 30 retains a high-impedance, low-leakage output.

It is noted that current mirror 20 is adapted to turn off at a predetermined rate by the addition of capacitor 40. The predetermined rate is established such that the integral of any current transients flowing into the darlington pair 33 from the output is substantially the same as the integral of any current transient flowing from the darlington pair 32 into the output as the OTA 10 transitions from the active mode to the stand-by mode. Therefore, essentially a zero net current flows out of the output buffer 30 when turned off, such that the output of an integrator (not shown) coupled to the output of the OTA 10 will not significantly change from the instant before the OTA 10 is commanded to enter the stand-by mode to the instant after the OTA 10 settles into the stand-by mode.

Transistor 15 is clamped by diodes 41 and transistor 42 with current sources 44a and 44b supplying current to insure that transistor 15 operates in the saturated region regardless of the operational mode (active, stand-by) of the OTA 10. This improves the common-mode response of the OTA 10, i.e., the response to a signal having the same polarity on both IN+ and IN− inputs with respect to ground, and the recovery time of the OTA 10 when placed in the active mode from stand-by. Similarly, transistor 16 is clamped by diodes 45 and transistor 46 along with current sources 47a, 47b supplying the required current.

Referring to FIG. 2, a S&H circuit 50 embodying the improved OTA 10 (FIG. 1) is diagrammed. The OTA 10 drives a conventional integrator formed by a conventional, high input impedance (low-leakage), operational amplifier 51 and a capacitor 52 in a feed-back loop to the amplifier 51. This configuration presents a virtual ground to the output of the OTA 10. The amplifier 51 is of conventional design and is preferably of the low-leakage input design, such as a JFET or MOSFET input type operational amplifier. During the sample mode of operation, the OTA 10 is active and current drawn from the capacitor 52 by OTA 10 causes the output of the amplifier 51 to increase until the output matches the input voltage applied to the inverting input (IN−) to the OTA 10 due to the output of the amplifier 51 being coupled to the non-inverting input (IN+) of the OTA 10. Hence the output of the amplifier 51 follows the input to the OTA 10. During the hold mode, the OTA 10 is on stand-by. Since the non-inverting input to the amplifier 51 is coupled to ground, there is essentially zero volts on the inverting input to the amplifier 51. As long as no current is injected by the OTA 10 into the capacitor 52 during the hold mode, the output of the amplifier 51 remains essentially the same as just before the hold mode was enabled. Since the output of the OTA 10 is referenced to ground by the output buffer 30 (FIG. 1) and the inverting input of the amplifier is substantially at zero volts, or ground, essentially no leakage current flows to or from the OTA 10 during the hold mode and the output of the amplifier 51 does not change. Further, as stated above, the equalizing of the integrals of the current output transients from OTA 10 when placed in stand-by (the S&H 50 entering the hold mode) essentially eliminates any pedestal error since the charge on capacitor 52 will not significantly differ from the charge thereon prior to the stand-by command to the OTA 10 to the charge thereof after the OTA 10 has settled in the stand-by mode.

Having described the preferred embodiment of this invention, it will now be apparent to one of skill in the art that other embodiments incorporating its concept may be used. It is felt, therefore, that this invention should not be limited to the disclosed embodiment, but rather should be limited only by the spirit and scope of the appended claims.

What is claimed is:

1. In an integrated circuit, an operational transconductance amplifier (OTA) (10) having:
   a differential input stage (15, 16, 18, 19) having inverting and noninverting differential inputs, a common output and first and second differential outputs;
   a first current mirror (20) responsive to the first differential output of the differential input stage and coupling to a first voltage source;
   a second current mirror (21) responsive to the second differential output of the differential input stage and coupling to the first voltage source; and,
   a third current mirror (28) responsive to the first current mirror and coupling to a second voltage source;
   a first bipolar transistor network (26) coupling between the first and third current mirrors, having an intermediate node coupling to a third voltage source;
   a second bipolar transistor network (32, 33) coupling between the second and third current mirrors, having an intermediate node coupling to the third voltage source, for providing an output signal from a high-impedance output node;
   wherein the third voltage source has a voltage between that of the first and second voltage sources.

2. The OTA recited in claim 1, the second bipolar transistor network characterized by:
   a first darlington transistor pair (32), having a base input, an emitter input and a collector ouptut, the base input coupling to a third voltage source, the emitter input coupling to the second current mirror, and the collector output coupling to the output node; and
   a second darlington transistor pair (33), having a base input, an emitter input and a collector output, the base input coupling to the third voltage source, the emitter input coupling to the third current mirror, and the collector output coupling to the output node.

3. The OTA recited in claim 2, characterized by resistors (32a, 33a) coupling between the base and emitter inputs of corresponding first and second darlington transistor pairs.

4. The OTA recited in claim 3, the first bipolar transistor network characterized by a third darlington transistor pair, with a base input, an emitter input and a collector output, wherein the base input couples to the third voltage source, the emitter input is responsive to the first current mirror, and the third current mirror is responsive to the collector output.

5. The OTA recited in claim 4, the first current mirror characterized by means (40) for decaying the output of the first current mirror at a predetermined rate when the first current mirror is turned off; wherein the predetermined rate is established such that the integral of any output current transient from the OTA is substantially the same as the integral of any output current transient into the OTA when the OTA is disabled.

6. The OTA recited in claim 5, wherein the means in the first current mirror is a capacitor.

7. The OTA recited in claim 6, characterized by:
   a first current source (38) coupling to the second supply voltage; and,
   a differential amplifier (35, 36, 37) responsive to a control signal and having a common output and first and second differential outputs, the first differential output coupling to the common output of the differential input stage, the second differential output coupling to the first voltage source and the comon output coupling to the first current source;
   wherein the first current source establishes the maximum gain of the OTA and the control signal selectively enables the OTA when current is passing through the first differential output from the first current source, and the control signal selectively disables the OTA when current passing through the second differential output is substantially the same as the current from the first current source.

8. The OTA recited in claim 7, wherein the first, second and third current mirrors are Wilson current mirrors.

9. The OTA recited in claim 8, the differential input stage characterized by:
   a pair of field-effect transistors (FETs) (15, 16), each one of the pair having a gate input and first and second outputs, the gate input of a first one of the pair coupling to the non-inverting input and the gate input of the second one of the pair coupling to the inverting input;
   a pair of transistors (18, 19) arranged to form a differential pair, each transistor responsive to the first output of the corresponding one of the pair of FETs and providing both the common output and the first and second differential outputs of the differential input stage; and,
   a pair of means (41, 42, 44a,b; 45, 46, 47a,b), each coupling across the outputs of the corresponding one of the pair of FETs, for biasing same with a predetermined voltage;
   wherein the predetermined voltage is sufficient to maintain the FETs in saturation.

10. The OTA recited in claim 9, each of the pair of means characterized by:
    a second current source (44a, 47a) coupling between the first output of the corresponding one of the pair of FETs and the first voltage source;
    a transistor (42, 46) having an emitter, a base and a collector, the emitter coupling to the second output of the corresponding one of the pair of FETs and the collector coupling to the second voltage source;
    a third current source (44b, 47b) coupling between the base of the transistor and the second voltage source; and,
    a plurality of voltage dropping means (41, 45), coupling between the first output of the corresponding one of the pair of FETs and the base of the transistor, for providing a voltage greater than the predetermined voltage.

11. The OTA recited in claim 10 wherein each of the voltage dropping means is a forward biased diode.

12. The OTA recited in claim 11 wherein the FETs are junction field effect transistors.

13. The OTA recited in claim 12, wherin the third voltage source has a potential of substantially zero volts (ground.)

14. A sample-and-hold (S&H) circuit (50), using the OTA recited in claim 13, for selectively sampling and holding the amplitude of an input signal, having:
an integrator (51, 52), having a virtual ground input responsive to the output of the OTA and an output;
wherein the non-inverting input of the OTA is responsive to the output of the integrator and the inverting input of the OTA is responsive to the input signal.

15. The S&H circuit recited in claim 14, the integrator having:
an high-gain inverting amplifier with an input and an output, the input being the input of the integrator and the output being the output of the integrator; and
a capacitor (52) coupling between the input and the output of the inverting amplifier.

16. The S&H recited in claim 15 wherein the high-gain inverting amplifier is an operational amplifier (51) with inverting and non-inverting differential inputs and a low-impedance output, the inverting input coupling to the capacitor and the non-inverting input coupling to ground.

17. A sample-and-hold circuit (S&H) (50) for selectively sampling and holding the amplitude of an input signal, having:
an operational transconductance amplifier (OTA) (10) having an inverting input, a non-inverting input and a high-impedance output, the inverting input responsive to the input signal; and,
an integrator (51, 52) having a virtual ground input responsive to the output of the OTA and an output coupled to the non-inverting input of the OTA;
wherein the OTA is characterized by:
a differential input stage (15, 16, 18, 19) having inverting and noninverting differential inputs, a common output and first and second differential outputs;
a first current mirror (20) responsive to the first differential output of the differential input stage and coupling to a first voltage source;
a second current mirror (21) responsive to the second differential output of the differential input stage and coupling to the first voltage source;
a third current mirror (28) responsive to the first current mirror and coupling to a second voltage source;
a first bipolar transistor network (26) coupling between the first and third current mirrors, having an intermediate node coupling to ground;
a second bipolar transistor network (32, 33) coupling between the second and third current mirrors, having an intermediate node coupling to ground, for providing an output signal from a high-impedance output node.

18. The S&H recited in claim 17, the second bipolar transistor network characterized by:
a first darlington transistor pair (32), having a base input, an emitter input and a collector output, the base input coupling to a third voltage source, the emitter input coupling to the second current mirror, and the collector output coupling to the output node; and a second darlington transistor pair (33), having a base input, an emitter input and a collector output, the base input coupling to the third voltage source, the emitter input coupling to the third current mirror, and the collector output coupling to the output node.

19. The S&H recited in claim 18, the first current mirror characterized by means (40) for decaying the output of the first current mirror at a predetermined rate when the first current mirror is turned off; wherein the predetermined rate is established such that the integral of any output current transient from the OTA is substantially the same as the integral of any current transient into the OTA when the OTA is disabled.

20. The S&H recited in claim 19, wherein the means in the first current mirror is a capacitor.

21. The S&H recited in claim 20, characterized by:
a first current source (38) coupling to the second supply voltage; and,
a differential amplifier (35, 36, 37) responsive to a control signal and having a common output and first and second differential outputs, the first differential output coupling to the common output of the differential input stage, the second differential output coupling to the first voltage source and the common output coupling to the first current source;
wherein the first current source establishes the maximum gain of the OTA and the control signal selectively enables the OTA when current is passing through the first differential output from the first current source, and the control signal selectively disables the OTA when current passing through the second differential output is substantially the same as the current from the first current source.

22. The OTA recited in claim 21, characterized by resistors (32a, 33a) coupling between the base and emitter input of corresponding first and second darlington pairs.

23. The S&H recited in claim 22, the first bipolar transistor network characterized by a third darlington transistor pair, with a base input, an emitter input and a collector output, wherein the base input couples to ground, the emitter input is responsive to the first current mirror, and the third current mirror is responsive to the collector output.

24. The S&H recited in claim 23, the differential input stage characterized by:
a pair of field-effect transistors (FETs) (15, 16), each one of the pair having a gate input and first and second outputs, the gate input of a first one of the pair coupling to the non-inverting input and the gate input of the second one of the pair coupling to the inverting input;
a pair of transistors (18, 19) arranged to form a differential pair, each transistor responsive to the first output of the corresponding one of the pair of FETs and providing both the common output and the first and second differential outputs of the differential input stage; and,
a pair of means (41, 42, 44a,b; 45, 46, 47a,b), each coupling between the outputs of the corresponding one of the pair of FETs, for biasing same with a predetermined voltage;
wherein the predetermined voltage is sufficient to maintain the FETs in saturation.

25. The S&H recited in claim 24, each of the pair of means characterized by:

a second current source (44a, 47a) coupling between the first output of the corresponding one of the pair of FETs and the first voltage source;

a transistor (42, 46) having an emitter, a base and a collector, the emitter coupling to the second output of the corresponding one of the pair of FETs and the collector coupling to the second voltage source;

a third current source (44b, 47b) coupling between the base of the transistor and the second voltage source; and, a plurality of voltage dropping means (41, 45), coupling between the first output of the corresponding one of the pair of FETs and the base of the transistor, for providing a voltage greater than the predetermined voltage.

26. The S&H recited in claim 25 wherein each of the voltage dropping means is a forward biased diode.

27. The S&H recited in claim 26 wherein the FETs are junction field effect transistors.

* * * * *